United States Patent [19]

Murray et al.

[11] Patent Number: 5,640,093
[45] Date of Patent: Jun. 17, 1997

[54] AUTOMOBILE ELECTRONIC CIRCUIT ANALYZER FOR DETECTING SHORTED ECM LOADS, INCLUDING A PULSATING POWER SUPPLY AND LOAD SENSING CELL

[75] Inventors: Michael T. Murray, Delran, N.J.; Luis F. Rodrigues, Bensalem, Pa.

[73] Assignee: Cardone Industries, Inc., Philadelphia, Pa.

[21] Appl. No.: 247,707

[22] Filed: May 23, 1994

[51] Int. Cl.$^6$ .................................................. F02P 17/00
[52] U.S. Cl. .......................... 324/379; 324/503; 324/525; 324/384
[58] Field of Search ............................ 324/378, 379, 324/380, 383, 384, 402, 503, 713, 525, 527; 123/416; 364/431.04; 340/524, 515, 653, 660

[56] References Cited

U.S. PATENT DOCUMENTS

| | | | |
|---|---|---|---|
| 3,935,427 | 1/1976 | Geul | 235/375 |
| 4,013,947 | 3/1977 | Arai | 324/503 |
| 4,752,959 | 6/1988 | Matsumoto | 381/59 |
| 4,764,727 | 8/1988 | McConchie, Sr. | 324/503 |
| 4,795,979 | 1/1989 | Kreft et al. | 324/379 |
| 4,878,025 | 10/1989 | Persson | 324/503 |
| 5,030,916 | 7/1991 | Bokitch | 324/503 |
| 5,068,613 | 11/1991 | Kreft et al. | 324/379 |
| 5,177,447 | 1/1993 | Marino et al. | 324/713 |
| 5,315,252 | 5/1994 | Puetz et al. | 324/384 X |

*Primary Examiner*—Sandra L. O'Shea
*Assistant Examiner*—J. Patidar
*Attorney, Agent, or Firm*—Woodcock Washburn Kurtz Mackiewicz & Norris

[57] ABSTRACT

An automotive electronic circuit analyzer that plugs into an automobile's electronic control module is disclosed. The disclosed analyzer includes positive and negative load sensing cells each having a series resistor coupled to an ECM load via the ECM connector and having an LED transistor for conducting current when the ratio between the load and the series resistor exceeds a predetermined value. A regulated power circuit for sinking current from the positive load sensing cells and for supplying current to the negative load sensing cells includes a timing circuit for controlling the active power pulse width so that the LEDs are illuminated with high frequency, short duration power pulses to indicate a shorted load.

11 Claims, 6 Drawing Sheets

AUTOMOBILE ELECTRONIC CIRCUIT ANALYZER FOR DETECTING SHORTED ECM LOADS, INCLUDING A PULSATING POWER SUPPLY AND LOAD SENSING CELL

FIELD OF THE INVENTION

The present invention relates to an automotive electronic circuit analyzer of the type that provides visual indications of low impedance loads, and more particularly to an on-board circuit analyzer that plugs into the automobile's Electronic Control Module ("ECM") slot.

BACKGROUND OF THE INVENTION

Electronic control modules ("ECMs"), also known as electronic computer control devices, are electronic modules that control the performance of an automobile's engine in response to various conditions input from sensors in the engine and other parts of the automobile. The ECM plugs into an electrical connector, through which it receives inputs from ECM sensors and through which it drives ECM loads, such as lamps, motors, solenoids or other switching devices. The ECM loads are driven by output transistors in the ECM. The output transistors of some ECMs can be damaged if connected to a load having a resistance below that specified by the automobile's manufacturer. For ease of discussion, the term "shorted load" will be used hereafter to include any load resistance below the manufacturer's specification for that load. Unfortunately, the existence of a shorted load is often discovered only when a second ECM is damaged in the course of troubleshooting a first ECM.

Traditionally, mechanics could troubleshoot defective ECMs by using expensive testing equipment supplied by the automobile's manufacturer or by plugging in a replacement ECM and risking damage to the replacement. Further, manufacturer supplied test equipment typically could not be used to service products of other manufacturers. Moreover, such prior art techniques typically involved the use of an ohmmeter, thus necessitating a relatively skilled operator.

It is therefore desirable to provide an automotive electronic circuit analyzer that provides a visual indication of shorted ECM loads, generates minimal electrical noise and consumes minimal power. It is further desirable to provide adaptor means to adapt such an automotive electronic circuit analyzer to a variety of ECMs.

SUMMARY OF THE INVENTION

Accordingly, it is the general object of the present invention to provide an automotive electronic circuit analyzer that provides a visual indication of shorted ECM loads, while generating minimal electrical noise and consuming minimal power. It is a further object to provide means to adapt such an automotive electronic circuit analyzer to a variety of ECMs.

In order to achieve the above and other objects of the invention, there is provided an automotive electronic circuit analyzer ("circuit analyzer") that plugs into a vehicle's ECM connector after the ECM has been removed from the vehicle. The circuit analyzer provides a visual indication of shorted loads, if any, in each of the various load circuits, so that problems in the load circuits may be corrected prior to the installation of an ECM. Removable adaptor cards provide means to adapt the circuit analyzer to function with various ECM connector pin assignments used by various automobile manufacturers.

In particular, the circuit analyzer of the present invention illuminates an LED to provide visual indication that the resistance of a particular electrical load connected to the ECM slot is below a specified threshold value. An LED transistor drives each LED as part of a load sensing cell. A zener diode at the base of the LED transistor sets a threshold current below which the LED will not illuminate. A resistor, connected in series with the ECM load, forms a voltage divider at the input of the zener diode. When the voltage at the voltage divider reaches the threshold voltage of the zener diode, current is allowed to flow to drive the LED transistor. The resistance value selected for the series resistor is determined by the threshold voltage of the zener diode and the manufacturer's resistance specification for the ECM load circuit. Because ECM loads typically have low resistances, the series resistor usually has a very low resistance value to provide adequate voltage gain. A pulsating power supply converts the voltage of the automobile's battery into a series of constant amplitude, narrow-width power pulses to drive the various load circuits. The narrow pulse-width reduces power consumption, while maintaining a sufficiently high frequency to provide a constant brightness in the load sensing cell LEDs. Moreover, the narrow power pulse-width reduces current flow through the low resistance series resistors, which keeps the temperature (and thermal noise) low and eliminates the need for noise reduction circuitry. To provide additional versatility, signals between the ECM connector and the circuitry of the circuit analyzer are routed to an adaptor slot. The adaptor slot includes a connector for receiving insertable adaptor cards to reroute signals between the ECM connector and the circuitry of the circuit analyzer, so that the analyzer can be adapted to correspond to the pin assignments of various ECMs.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

DETAILED DESCRIPTION OF THE INVENTION

Figure 1A:
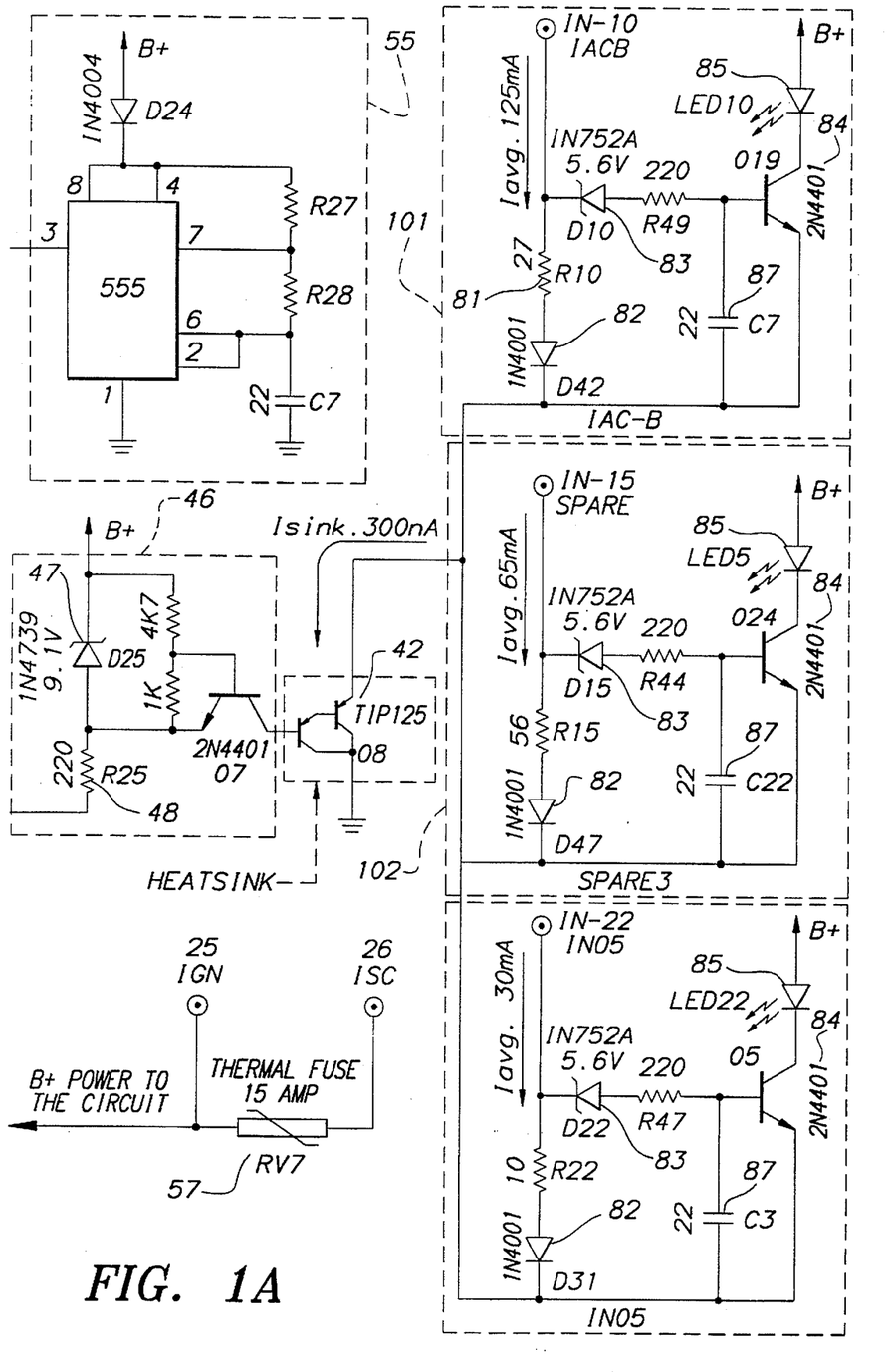
FIGS. 1A and 1B depict a circuit diagram showing a preferred embodiment of the present invention, having six load sensing cells.
Figure 1B:
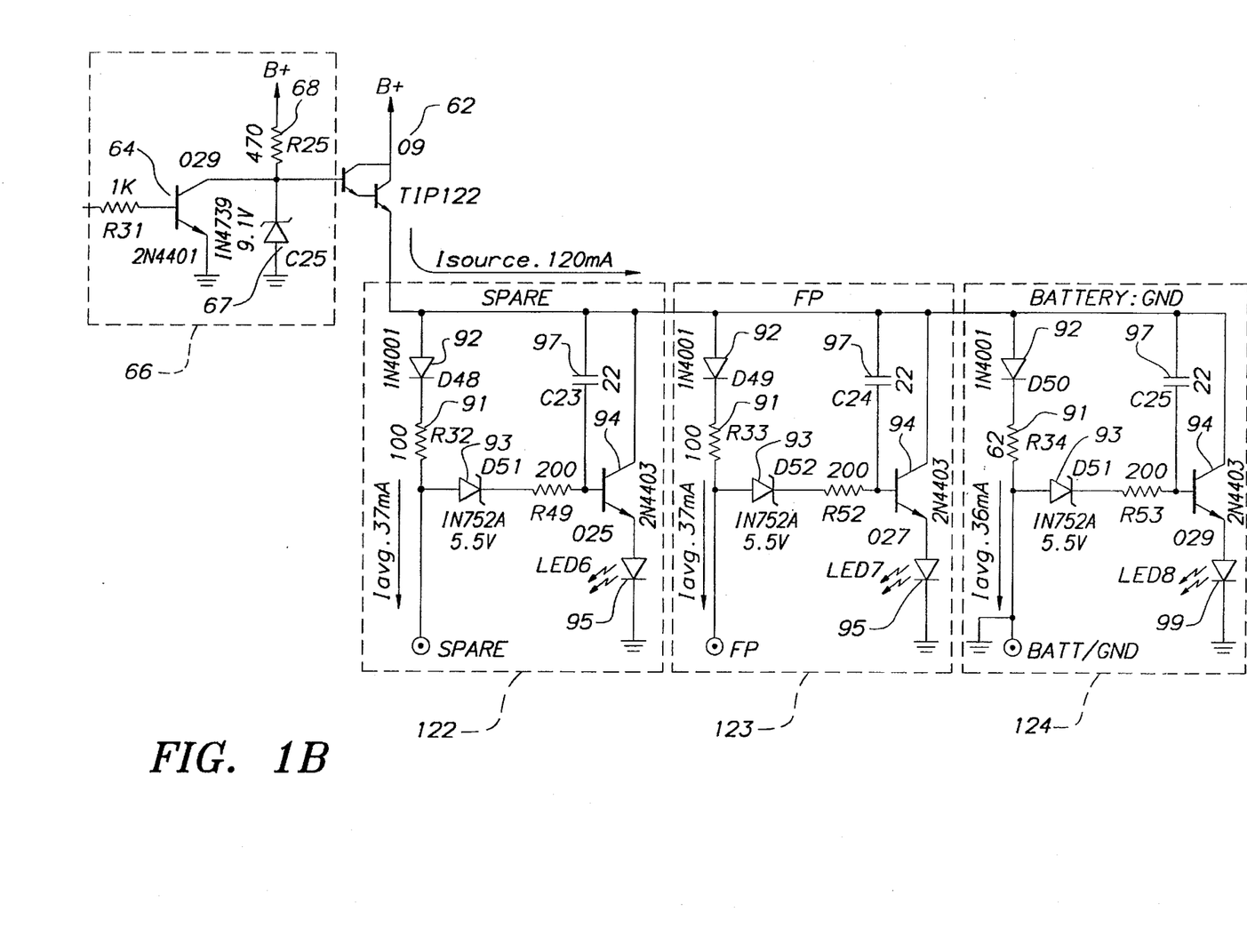
Figure 5:
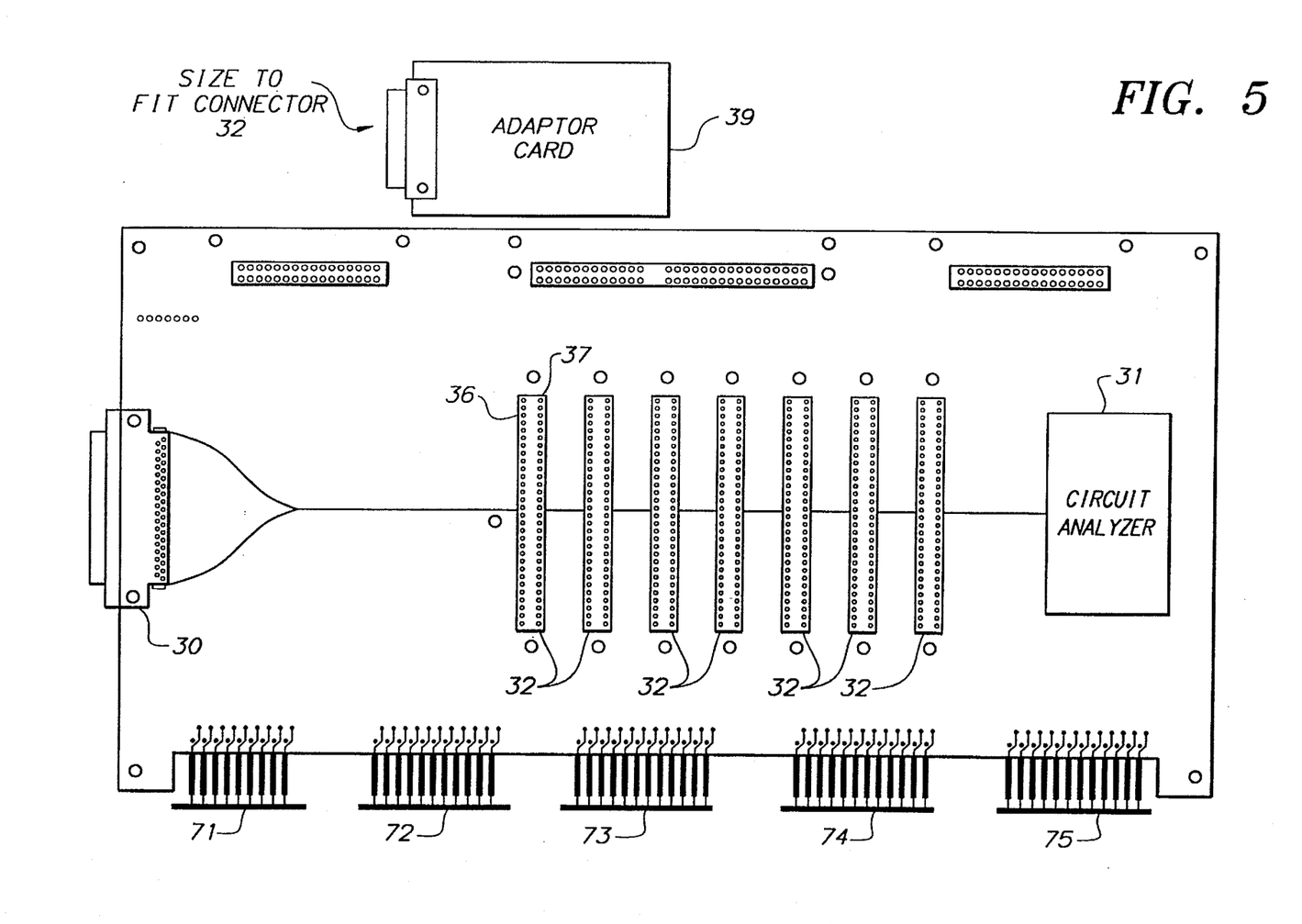
FIG. 5 shows an embodiment of the adaptor connector of the present invention.

Referring to the drawings, there is shown in FIGS. 1A and 1B a circuit diagram showing a preferred embodiment of the present invention. The analyzer is powered by the automobile's 12 volt battery or an equivalent power source, through the automobile's Electronic Control Module connector 30 (FIG. 5). The positive battery terminal is connected to input 25 (FIG. 1A) of ECM connector 30 and the battery ground is connected to input 24 (FIG. 1B) of ECM connector 30. Preferably, thermal fuse 57 (FIG. 1A) is also included in the power supply line.

Power from the battery B+ is applied to pulsating power supply 35 (FIG. 4) and to input 26 of ECM connector 30, which supplies power to the automobile's idle speed control (ISC) device during testing.

Figure 2:
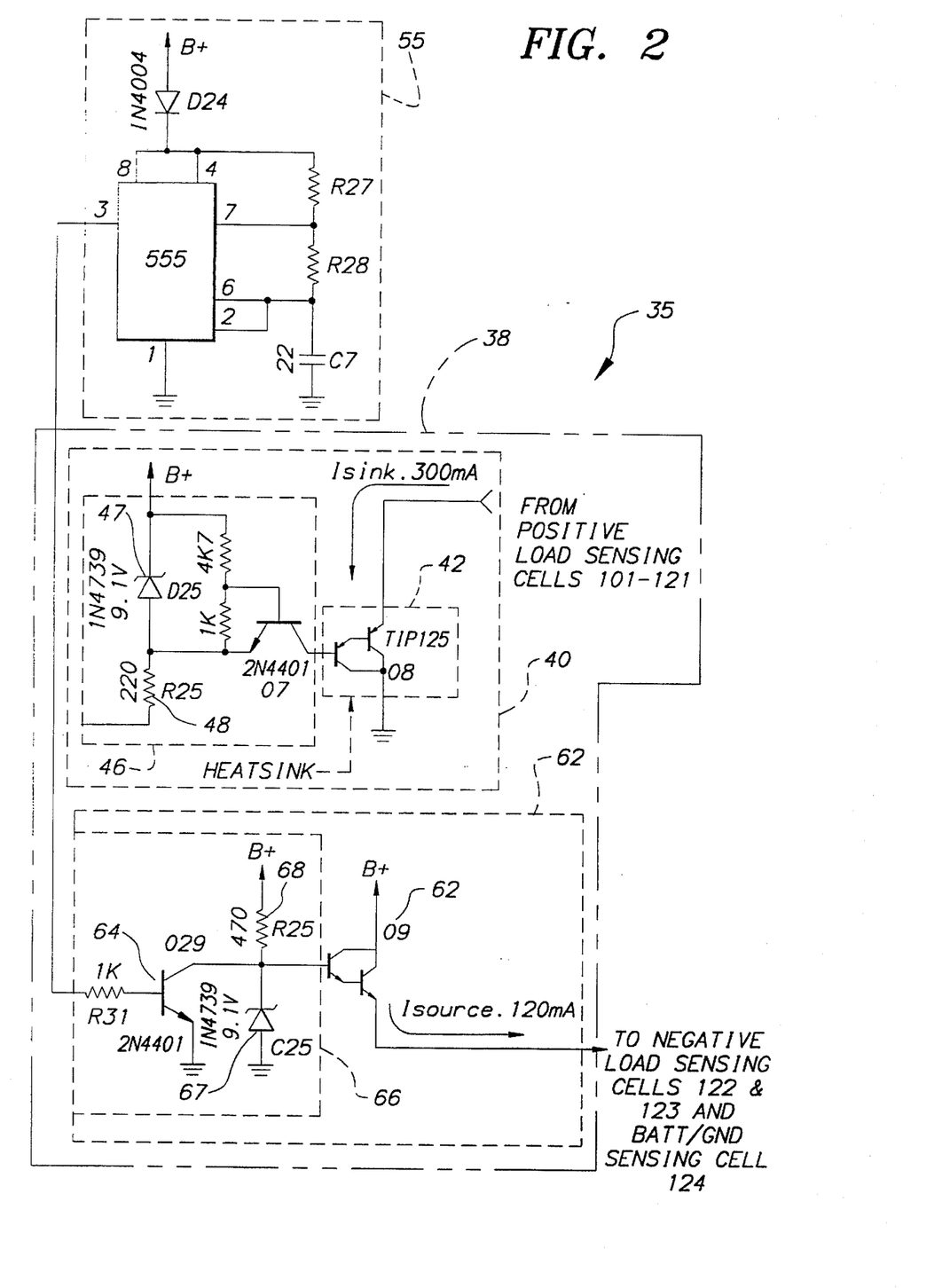
FIG. 2 is a circuit diagram of the pulsating power supply of a preferred embodiment of the present invention.
Figure 3A:
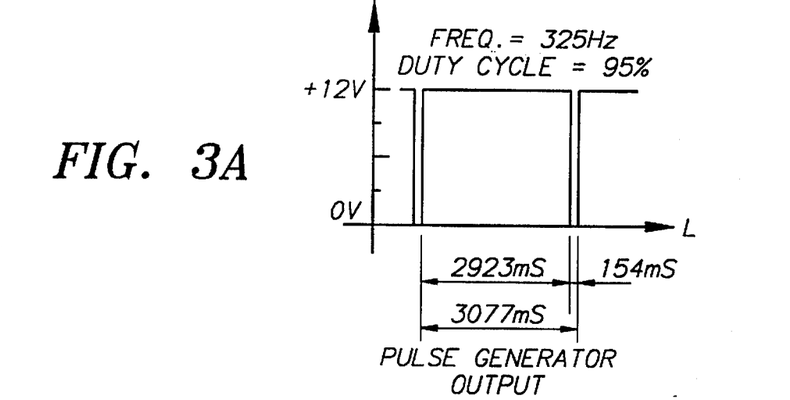
FIG. 3A is a graph showing the output duty cycle of a pulse generator circuit of a preferred embodiment of the invention.
Figure 3B:
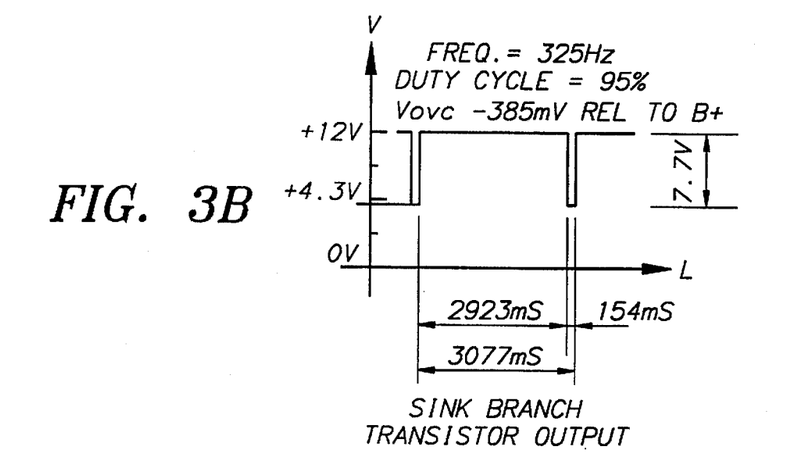
FIG. 3B is a graph showing the output duty cycle of the sink branch of the regulated power circuit of a preferred embodiment of the invention.
Figure 3C:
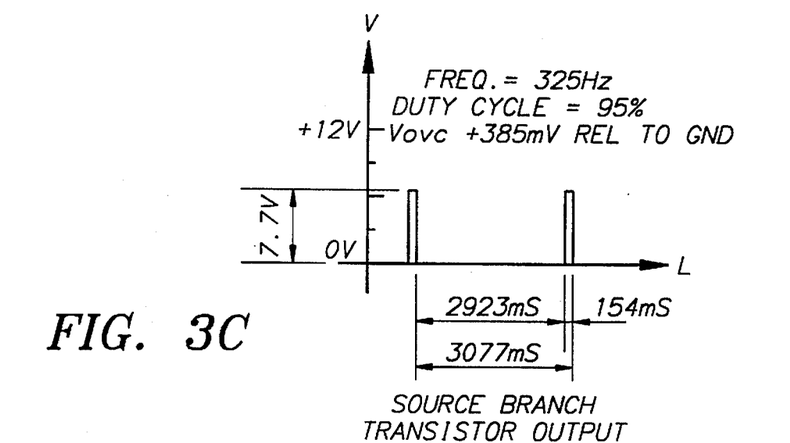
FIG. 3C is a graph showing the output duty cycle of the source branch of the regulated power circuit of a preferred embodiment of the invention.

Pulsating power supply 35 (FIG. 2) converts the received d-c power to a series of constant amplitude, narrow-width power pulses, as shown in FIGS. 3A–3C. The power pulses derive from control pulses generated by pulse generator 55 (FIG. 1A), which in the preferred embodiment is a 555 integrated circuit timer, operating at a nominal frequency of 325 Hz, with a nominal duty cycle of 95%. The remaining 5% off time pulse, which has a duration of 154 µsec., is the active portion of the pulse. The off-time pulse drives the bases of transistors 42, 62 in regulated power circuit 38 to apply pulsating power to load sensing cells 101–124

The output pulses from power transistors 42, 62 maintain a constant amplitude of approximately 7.7 volts peak-to-peak, in the preferred embodiment. Power transistors 42, 62 act as voltage regulators to maintain constant output amplitude, unaffected by minor variations in the voltage of the automobile's battery.

Because ECM loads may be coupled to either the positive or the negative terminals of the automobile battery, regulated power circuit 38 includes two zener diode regulated branches 40, 60. The sink power circuit branch 40, which includes zener diode 47 and transistor 42, supplies constant amplitude, negative-going pulses to sink current from load sensing cells 101–121 connected to positive loads 1–21. The source power circuit branch 60, which includes zener diode 67 and transistor 62, supplies constant amplitude, positive-going pulses to supply current to load sensing cells 122–124 connected to negative loads 22–24.

1. THE SINK POWER CIRCUIT

Sink power circuit 40 (FIG. 2) pulls pulsating current from positive load sensing cells 101–121. In the preferred embodiment, the pulsating signal connected to positive load sensing cells 101–121 has the following nominal characteristics:

| | |
|---|---|
| V. max. | 12.0 V @ 12 V B+ (variable with B+ and loads) |
| V. min. | 4.3 V @ 12 V B+ (variable with B+ and loads) |
| V p-p | 7.7 V (constant) |
| Frequency | 325 Hz |
| Period | 3.077 ms |
| Duty Cycle | 95% |
| On-Time Pulse | 2.923 mS |
| Off-Time Pulse | 154 µs (Active Pulse) |

Active Avg. Output Voltage: –38 mV relative to B+
Active Avg. Output Current @ 12 V, all LOADs shorted: –300 mA As will be appreciated by one skilled in the art, these values may vary with component tolerances and the status and the magnitude of the loads connected.

THE OFF-TIME CONTROL PULSE

The battery (B+) is connected to the positive terminal of each positive load sensing cell 101–121. Sink power circuit 40 (FIG. 2) is connected to the negative terminal of these cells. The current flows from the battery (B+), through each cell circuit (including the LOAD), down to the sink power circuit transistor 42. This current flows only during short periods of time, controlled by pulse generator circuit 55.

Zener regulator circuit 46 (FIGS. 1A and FIG. 2) maintains a constant voltage between the battery (B+) and the base of transistor 42 so that it is not affected by voltage variations in the battery. In zener regulator circuit 46, the power source (battery B+) is applied to a 9.1 volt zener diode 47. A 220 Ohm current limiting resistor 48 is connected from zener diode 47 to the output of pulse generator 55. While the output signal of pulse generator 55 stays at its LOW state or zero volts (for 154 microseconds), current will flow through zener regulator circuit 46, building up a constant voltage of –9.1 volts relative to the battery positive terminal (B+). This voltage is then applied to the base of the Darlington transistor 42, through the 2N4401 protection transistor 44, which function will be explained later.

The transistor 42 is connected as an emitter-follower, meaning that, the buffered voltage signal out of the 42 emitter will closely reproduce the voltage (relative to B+) at the point where zener diode 47 connects to resistor 48. This circuit provides a constant voltage difference between the emitter of transistor 42 and the battery B+, which provides a regulated voltage source for positive load sensing cells 101–121. This feature makes the circuit analyzer insensitive to differences in battery voltage, as long as the battery voltage remains above +9.5 volts relative to the ground.

THE ON-TIME CONTROL PULSE

After 154 milliseconds the pulsating output signal of pulse generator 55 will go HIGH (+12 volts) for 2.922 milliseconds, turning OFF the current across zener diode 47. Since there is no voltage buildup across zener diode 47, no current will flow through the BASE-EMITTER junction of transistor 42, and this transistor will be turned OFF. With transistor 42 turned OFF, no current will flow through positive load sensing cells 101–121.

The ON-OFF (short pulse) switching feature of sink power circuit 40 reduces power consumption and allows implementation of the load sensing cell circuitry with low wattage and low resistance components. Since, in the preferred embodiment, the frequency of pulse generator 55 is 325 Hz, the load sensing cell LEDs will show a constant brightness.

THE PROTECTIVE TRANSISTOR

If the ignition of the automobile is turned on and the battery power (B+) is not connected to the analyzer, pulse generator 55 will not function and transistor 42 will not be pulse controlled. Since the automobile's battery (B+) power is directly connected to positive loads 1–21 through the automobile's own wiring, current will find a free path from these loads 1–21 through sensing cells 101–121 and through uncontrolled and conductive transistor 42. Under these conditions, the base voltage of transistor 42 would stay lower than the emitter voltage, turning on transistor 42, allowing a large, damaging current to flow through cells To prevent damage, protective transistor 44 (type 2N4401 in the preferred embodiment), which is connected between zener diode 47 and the base of transistor 42, senses the presence or absence of the battery power (B+) in the analyzer circuitry. If battery power connection (B+) is missing, transistor 44 will shut down the control current to the base of transistor 42, turning it off to prevent damaging current flow through cells 101–121.

2. THE SOURCE POWER CIRCUIT

The source power circuit 60 supplies pulsating current to the negative load sensing cells 122–124. In the preferred embodiment, the pulsating signal supplied to cells 122–124 has the following characteristics:

| | |
|---|---|
| V max. | 7.7 V |
| V min. | 0.0 V |
| V p-p | 7.7 V (constant) |
| Frequency | 325 Hz |
| Period | 3.077 mS |
| Duty Cycle | 5% |
| On-Time Pulse | 154 μS (Active Pulse) |
| Off-Time Pulse | 2.923 mS |

Active Avg Output Voltage: +385 mV relative to GND
Active Avg Output Current @ 12 V, all LOADS shorted: +120 mA
As will be appreciated by one of skill in the art, these values may vary with component tolerances and the status and the amount of loads connected.

THE OFF-TIME CONTROL PULSE

The negative terminal of each negative load sensing cell 122–124 is connected to GROUND. Source power circuit 60 (FIG. 2) is connected to the positive terminal of cells 122–124. Current flows from source power circuit transistor 62, through each cell circuit (including the LOAD), down to GROUND. Current flows only during short periods of time, controlled by a pulse generator circuit 55 (FIG. 2).

Zener regulator circuit 66 maintains the voltage between GROUND and the base of transistor 62, so that it is not affected by minor variations in the voltage supplied by the automobile's battery. A 9.1 volt zener diode 67 is used in conjunction with a 470 Ohm current limiting resistor 68 to maintain the voltage at the base of transistor 62. While the pulsating output signal of pulse generator 55 stays at its LOW state or zero volts (for 154 microseconds), intermediate transistor 64 will stay OFF and current will flow through zener regulator circuit 66, building up a constant voltage of +9.1 volts relative to GROUND. This voltage is then applied to the base of Darlington transistor 62.

Transistor 62 is connected as an emitter-follower, meaning that, the buffered voltage signal at the emitter of transistor 62 will closely reproduce the voltage (relative to B+) at the point where zener diode 67 connects to resistor 68. This circuit creates a constant voltage difference between the emitter of transistor 62 and GROUND, which provides a regulated voltage source for negative load sensing cells 122–124. This feature makes the circuit analyzer insensitive to differences in battery voltage above +9.5 volts relative to ground.

THE ON-TIME CONTROL PULSE

After 154 milliseconds, the output signal of pulse generator 55 will go HIGH (+12 volts) for 2.922 milliseconds, turning OFF the current across zener diode 67. The current flowing through the base of intermediate transistor 64, will turn this transistor ON, shorting any voltage buildup across zener diode 67. Since there is no voltage buildup across zener diode 67, no current will flow through the BASE-EMITTER junction of transistor 62, and this transistor will be turned OFF. With transistor 62 turned OFF, no current will flow through the negative load sensing cells.

The ON-OFF (short pulse) switching feature of source power circuit 60 reduces power consumption and makes implementation of the load sensing cell circuitry with low wattage and low resistance components. Since the frequency of pulse generator 55 is 325 Hz, the load sensing cell LEDs will show a constant brightness.

B. THE LOAD SENSING CELLS

Figure 4:
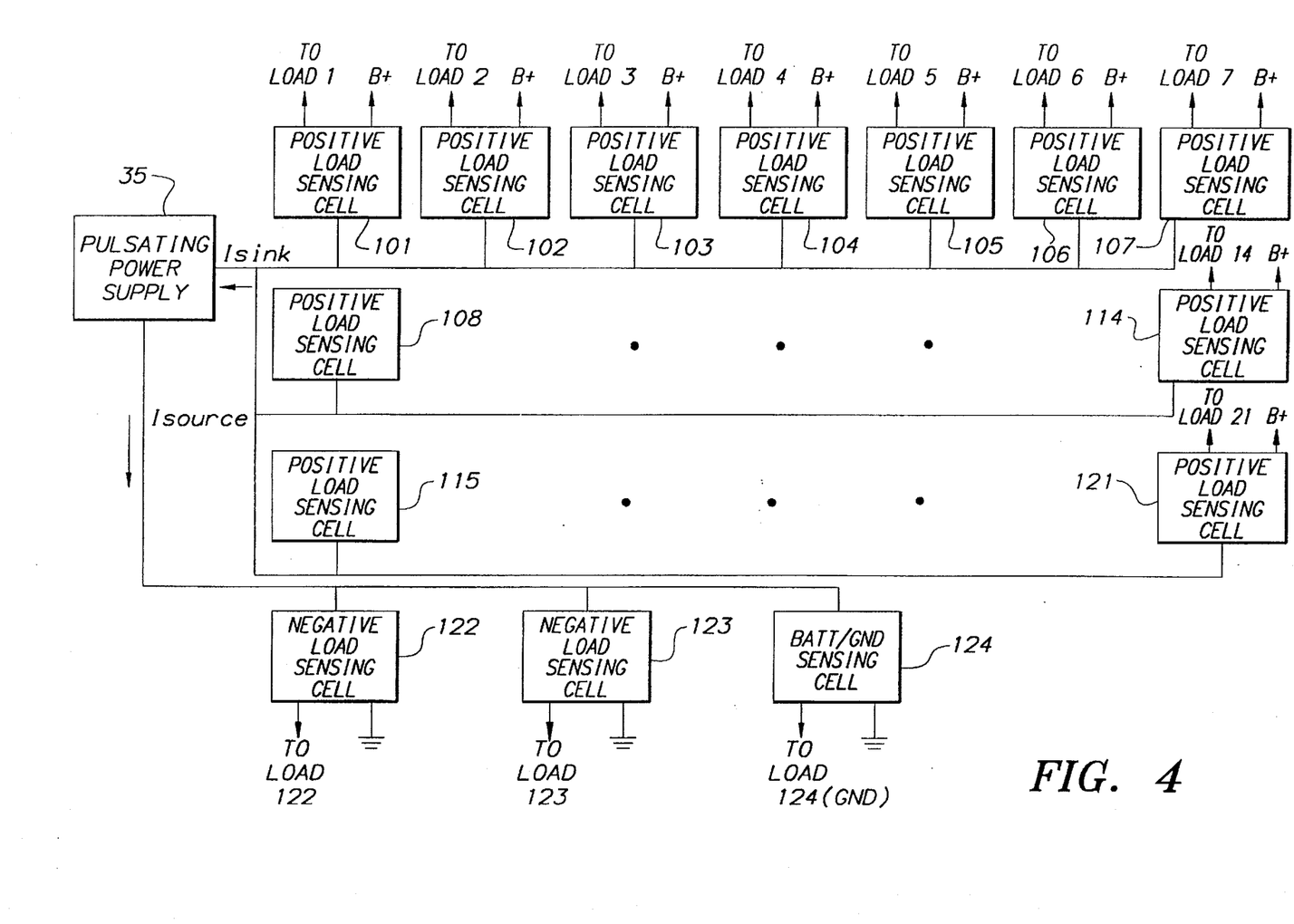
FIG. 4 is a block diagram illustrating components of an embodiment the present invention having twenty-four load sensing cells.

The preferred embodiment of the automotive electronic circuit analyzer shown in FIG. 4 includes twenty-one positive load sensing cells 101–121, two negative load sensing cells 122–124, and a BATT/GND sensing cell 125 connected to ground to indicate the status of the POWER and GROUND connections.

To obtain the voltage gain necessary to drive the LED transistors of the load sensing cells 101–121, low-Ohm resistors 81 are connected in series with each of loads 1–21, to form voltage dividers. Because low Ohm resistors are used, a heavy flow of current would be expected to flow through resistor 81, consuming a large amount of power and generating unwanted heat. The narrow width of the power pulses from pulsating power supply 35, however, greatly reduces power consumption by limiting the current flow to only a short period in each interval. The reduced current through resistor 81 keeps the temperature of the resistor low, eliminating the need for extensive and electrically noisy amplification circuitry.

LEDs respond to power peaks, rather than to power average. The present invention takes advantage of this characteristic by applying power to LED 85 as a series of short duration pulses so that the brightness of LED 85 appears constant to the human eye.

The type of the LEDs used on the circuit analyzer is important to the performance of load sensing cells 101–121. The circuit analyzer circuitry has been designed to operate the LEDs at approximately 20 mA. It has been found that LEDs available from Martech International Corporation are suitable, because they feature more brightness per mA than conventional LEDs, illuminate at currents as low as 5 mA, and withstand currents as high as 50 mA. In the preferred embodiment of the invention, the color of the shorted load indicator LEDs is transparent RED (Martech International Corporation, reference no. MT 5000-UR.) The color of the BATT/GND indicator LED is transparent GREEN (Martech International Corporation, reference no. MT 700-CUG.)

The invention uses two distinguishable visible states to indicate the two possible load circuit conditions: shorted and not shorted. In the presently preferred embodiment of the invention, an illuminated LED indicates a shorted load circuit. Of course, an illuminated LED could be used to indicate a load within specification and an unilluminated LED could be used to indicate a shorted load. Similarly, two different colors or two different intensity levels could be used to indicate the two load circuit conditions.

1. THE POSITIVE LOAD SENSING CELLS

In the preferred embodiment, positive load sensing cells 101–121 are designed to operate with three different resistive load values: 20 Ω, 10-Ω and 1 Ω. Positive load sensing cells 101–121 are identical except for a series resistor 81 connected in series with the load under test. The magnitude of series resistor 81 depends on the resistive value of the load. The load and series resistor 81 combination, being part of a resistive voltage divider, determines the voltage that will trigger the LED circuit when the load resistance drops below the threshold value.

The following table lists the resistive testing limits and corresponding series resistor for each load type. It also lists the corresponding inputs and the average value of the pulsating current through the resistive voltage divider when each such load is completely shorted.

| LOAD LIMIT | SERIES RES. | "SHORT" Iavg |
|---|---|---|
| 20 Ohm | 56 Ohm | 6.5 mA |
| 10 Ohm | 27 Ohm | 12.5 mA |
| 1 Ohm | 10 Ohm | 30.0 mA |

Since positive loads 1–21 are connected to the battery B+, current flows through the load, series resistor 81 and protective diode 82, to sink power circuit 40. This current is present only when the output of pulse generator 55 is at its low state.

As a load becomes defective and its resistance decreases below its specified threshold, the cell current and, consequently, the voltage across series resistor 81 will increase. If this voltage exceeds the breakdown voltage of 5.6 volt zener 83, this diode will become reversed biased, and will conduct. Current will start flowing through the base-emitter junction of LED transistor 84, turning it ON. A current of approximately 20 mA will cause LED 85 to remain illuminated.

Since the current from power supply 35 is pulsating, a 0.22 µF capacitor 87 is incorporated to smooth out the pulses at the base of the LED transistor 84, thereby increasing the selectivity of the circuit. The performance of circuit relies on the precision of 5.6 Volt zener diode 83, and 9.1 volt zener diode 47 of pulsating power supply 35.

Inputs to positive load cells 101–121 must always correspond to loads connected to the battery positive (B+). If a negative load is mistakenly connected to a positive input, a heavy and damaging current will flow from the positive load to the negative load. To eliminate this problem, protective diode 82 (type 1N4004 in the preferred embodiment) is connected to series resistor 81 to prevent the flow of damaging current.

2. THE NEGATIVE LOAD SENSING CELLS

The preferred embodiment of the present invention is directed to an ECM having only one type of negative resistive load, therefore, negative load sensing cells 122–123 cover only one resistive type. The load resistor value and the 20 Ω series resistor combine to form a resistive voltage divider that determines the voltage that will trigger the LED circuit when the load resistance drops below the threshold value.

The following table lists the resistive testing limit and corresponding series resistor for the load. It also lists the corresponding inputs and the average value of the pulsating current through the resistive voltage divider when the load is completely shorted.

| LOAD LIMIT | SERIES RES. | "SHORT" Iavg | INPUT NUM. |
| --- | --- | --- | --- |
| 20 Ohm | 100 Ohm | 3.7 mA | 16 and 17 |

Since negative loads 22–23 are connected to GROUND, the current supplied by source power circuit 60 will flow to GROUND through protective diode 92, series resistor 91 and the load. This current is present only when the output of pulse generator 55 is at its low state.

As a LOAD becomes defective and its resistance decreases below the threshold value, the cell current and consequently, the voltage across the series resistor 91 will increase. If the voltage across/at the series resistor overcomes the breakdown point of the 5.6 volt zener 93 (FIG. 1B), this diode will become reversed biased, and will conduct. Current will start flowing through the base-emitter junction of LED transistor 94, turning it ON. The LED will stay lit by a current of approximately 20 mA, as long as this condition is present.

Since the current is pulsating, a 0.22 µF capacitor 97 is incorporated to smooth out the pulses at the base of LED transistor 94, increasing the selectivity of the circuit. The performance of this circuit relies on the precision of 5.6 Volt zener diode 93, and 9.1 Volt zener diode 67 of pulsating power supply 35.

Inputs to negative load cells 122–123 must always correspond to loads connected to GROUND. If a positive load is mistakenly connected to a negative input, a heavy and damaging current will flow from the positive load to the negative load. To eliminate this problem, the protective diode 92 (1N4004) is connected to series resistor 91 to prevent the flow of damaging current.

3. THE BATTERY/GROUND SENSING CELL

The BATT/GND sensing cell 124 has the same characteristics and functionality as negative load sensing cells 122–123. However, series resistor 91 has a value of 8.2 Ohms and the load is always 0.0 Ohms (providing the battery connections are not defective). Consequently, the green LED 99 should always stay ON for as long as power is applied to the automotive electronic circuit analyzer. Load sensing cell 124 will turn OFF LED 99 when the resistance of either the BATTERY or the GROUND connection increases above 8 Ohms.

The following table lists the resistive testing limit and corresponding series resistor for each load. It also lists the average value of the pulsating current through the resistive voltage divider when the load is completely shorted.

| LOAD LIMIT | SERIES RES. | "SHORT" Iavg | INPUT NUM. |
| --- | --- | --- | --- |
| 8 Ohm | 8.2 Ohm | 35 mA | Internal |

Since the GROUND is directly connected to the circuit, the current supplied by source power circuit 60 will flow through protective diode 92 and series resistor 91 to GROUND. This current is present only when the output of pulse generator 55 is at its low state.

C. Adaptor Cards

The particular wiring arrangements used for ECMs by various automobile manufacturers differ. The circuit analyzer may be adapted to function with any of several ECMs, each having a different connector pin assignment. For example, if the analyzer circuitry is presently configured for an ECM having a BATT/GND connection at connector input 24 and IGN at connector input 25, but it is desired to test an automobile having an ECM BATT/GND connection at input 25 and IGN at input 24, means must be provided to reroute these two circuits. The present invention accomplishes this function by means of insertable adaptor cards that plug into one or more connector slots.

Referring now to FIG. 5, signals between ECM connector 30 and circuitry 31 of the circuit analyzer are routed to one or more adaptor connectors 32 mounted on the circuit analyzer board. Adaptor connector 32 has a first section 36 for coupling to ECM connector 30 and a second section 37 for coupling to circuit analyzer circuitry 31. As will be appreciated by one skilled in the art, the particular connector pins comprising each such section need not be contiguous, but instead may be located apart from one another. Adaptor cards 39 inserted into adaptor connector 32 reroute signals between the ECM connector 30 and circuit analyzer circuitry 31, so that signals to and from circuitry 31 may be adapted to correspond to the pin assignments of various ECM connectors 30. Jumper wires or circuit traces printed on adaptor card 39 reroute signals between first section 36 and second section 37 of adaptor connector 32.

The circuit analyzer may also be provided with breakout connector tabs 71–75. Tabs 71–75 are coupled to ECM connector 30, to provide convenient access to each ECM load circuit. This facilitates troubleshooting with an ohm meter or other instrument.

The present invention may be embodied in other specific forms without departing from the spirit or essential attributes thereof and, accordingly, reference should be made to the appended claims, rather than to the foregoing specification, as indicating the scope of the invention.

We claim:

1. An automotive circuit analyzer, for detecting whether a load resistance is below a prescribed value, that plugs into an automobile's ECM connector slot in place of the ECM, comprising:

a connector for coupling the circuit analyzer to an automobile's ECM connector slot;

a positive load sensing cell coupled to a positive load circuit in the automobile via the connector, for sensing the load resistance and illuminating an LED when the sensed resistance value of the load is below a prescribed threshold value; and a pulsating power supply coupled to the positive load sensing cell, for energizing the positive load sensing cell with a series of high-frequency, narrow-width power pulses.

2. The analyzer of claim 1, wherein the positive load sensing cell comprises a series resistor coupled to the positive load via the ECM connector, the series resistor and load forming a voltage divider junction, an LED transistor driven by the voltage at the voltage divider junction for conducting current when the ratio between the load and the series resistor exceeds a predetermined value, the LED transistor coupled to the LED, wherein the LED illuminates when current flows through the LED transistor.

3. The analyzer of claim 1, wherein the pulsating power supply further comprises:

a protective transistor to detect the absence of battery power to the circuit analyzer and prevent current flow through the load sensing cell.

4. The analyzer of claim 1, further comprising:

a negative load sensing cell, operatively coupled to said pulsating power supply, comprising a series resistor for coupling to a negative load via the ECM connector, an LED transistor for conducting current when the ratio between the load and the series resistor exceeds a predetermined value, and a second LED, coupled to the LED transistor of the negative load sensing cell, for illuminating when current flows through the LED transistor; and a source power circuit, operatively coupled to said negative load sensing cell, for supplying current to the negative load sensing cell.

5. The analyzer of claim 1, wherein the load sensing cell further comprises:

a protective diode connected in series with the load under test to prevent the flow of damaging current through the load sensing cell from a reverse polarity load.

6. The analyzer of claim 1, further comprising:

an adaptor connector for receiving an adaptor card, the adaptor connector having a first section coupled to the electronic control module connector and a second section coupled to the load sensing cell and the pulsating power supply; and an adaptor card insertable into the adaptor connector for coupling signals between the first section and the second section of the adaptor connector, the adaptor card routing signals between the electronic control module connector and the load sensing cell.

7. An automotive circuit analyzer that plugs into an automobile's electronic control module connector slot in place of the electronic control module, comprising:

a load sensing cell coupled to an electronic control module load circuit via the electronic control module connector, for generating an output signal, the output signal being in a first state when the load circuit resistance is greater than or equal to a threshold value and being in a second state when the load circuit resistance is less than the threshold value;

a display means coupled to receive the load sensing cell output signal, the display means for displaying a first visually perceptible state when the signal received from the load sensing cell is in its first state and for displaying a second visually perceptible state when the signal received from the load sensing cell is in its second state; and a pulsating power supply coupled to the load sensing cell, for energizing the load sensing cell with a series of high-frequency, narrow-width power pulses.

8. An automotive circuit analyzer that plugs into an automobile's electronic control module connector slot in place of the electronic control module, comprising:

a positive load sensing cell having a series resistor for coupling to a positive load via the ECM connector and having an LED transistor for conducting current when the ratio between the load and the series resistor exceeds a predetermined value;

a first LED, coupled to the LED transistor of the positive load sensing cell, for illuminating when current flows through the LED transistor of the positive load sensing cell;

a negative load sensing cell having a series resistor for coupling to a negative load via the ECM connector and having an LED transistor for conducting current when the ratio between the load and the series resistor exceeds a predetermined value;

a second LED, coupled to the LED transistor of the negative load sensing cell, for illuminating when current flows through the LED transistor of the negative load sensing cell;

a sink power circuit for sinking current from the positive load sensing cell;

a source power circuit for supplying current to the negative load sensing cell;

a timing circuit coupled to the sink power circuit and to the source power circuit for providing a signal having a frequency of about 325 Hz and having an active state pulse width of less than 10% of the duty cycle, the timing circuit signal controlling the sink and source power circuits, so that the sink power circuit sinks power only when the timing signal is in its active state and the source power circuit supplies current only when the timing signal is in its active state.

9. The analyzer of claim 8, wherein the sink power circuit comprises:

a protective transistor to detect the absence of battery power to the circuit analyzer and prevent current flow through the load sensing cell.

10. The analyzer of claim 8, wherein at least one of the load sensing cells further comprises:

a protective diode connected in series with the load under test to prevent the flow of damaging current through said at least one load sensing cell from a reverse polarity load.

11. The analyzer of claim 8, further comprising:

an adaptor connector for receiving an adaptor card, the adaptor connector having a first section coupled to the electronic control module connector and a second section coupled to the load sensing cell and the pulsating power supply; and an adaptor card insertable into the adaptor connector for coupling signals between the first section and the second section of the adaptor connector, the adaptor card routing signals between the electronic control module connector and the load sensing cell.

* * * * *

UNITED STATES PATENT AND TRADEMARK OFFICE
CERTIFICATE OF CORRECTION

PATENT NO. : 5,640,093
DATED : June 17, 1997
INVENTOR(S) : Murray et al.

It is certified that error appears in the above-indentified patent and that said Letters Patent is hereby corrected as shown below:

Column 2, Line 59, delete "embodiment the present" and insert --embodiment of the present-- therefor.

Column 3, Line 45, after "101-121" insert --(FIG. 4)-- .

Column 4, Line 54, after "to flow through cells" insert --101-121.-- therefor.

Column 4, Line 64, after "circuit 60" insert --(FIG. 2)--.

UNITED STATES PATENT AND TRADEMARK OFFICE
CERTIFICATE OF CORRECTION

PATENT NO. : 5,640,093
DATED : June 17, 1997
INVENTOR(S) : Murray et al.

It is certified that error appears in the above-indentified patent and that said Letters Patent is hereby corrected as shown below:

Please replace drawing sheets 1A, 1B and 2 with the attached replacement drawing sheets.

Signed and Sealed this

Sixth Day of January, 1998

Attest:

BRUCE LEHMAN

Attesting Officer

Commissioner of Patents and Trademarks